US008212754B2

(12) United States Patent
Nishimura

(10) Patent No.: US 8,212,754 B2
(45) Date of Patent: Jul. 3, 2012

(54) GRAYSCALE VOLTAGE GENERATING CIRCUIT PROVIDING CONTROL OF GRAYSCALE RESISTOR CURRENT

(75) Inventor: Kouichi Nishimura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 969 days.

(21) Appl. No.: 11/524,301

(22) Filed: Sep. 21, 2006

(65) Prior Publication Data

US 2007/0063948 A1 Mar. 22, 2007

(30) Foreign Application Priority Data

Sep. 22, 2005 (JP) ................................. 2005-274960

(51) Int. Cl.
*G09G 3/36* (2006.01)
*G09G 5/10* (2006.01)
*H03M 1/78* (2006.01)

(52) U.S. Cl. ........................... 345/89; 345/690; 341/154

(58) Field of Classification Search .............. 345/87–98, 345/211, 690; 341/144, 51, 154
See application file for complete search history.

(56) References Cited

U.S. PATENT DOCUMENTS 5,625,387 A * 4/1997 Moon ............................. 345/89
5,640,174 A * 6/1997 Kamei et al. .................... 345/89
5,854,627 A * 12/1998 Kurihara et al. ................ 345/89
5,883,798 A * 3/1999 Yamaguchi ...................... 363/73
6,157,335 A * 12/2000 Suzuki et al. ................. 341/144
6,437,716 B2 * 8/2002 Nakao ............................. 345/98
6,690,149 B2 * 2/2004 Monomoushi et al. ....... 345/210
6,781,605 B2 * 8/2004 Kudo et al. ................... 345/690
6,831,620 B1 * 12/2004 Nishikubo et al. .............. 345/89
7,102,424 B2 * 9/2006 Vorenkamp ................... 341/154
7,307,610 B2 * 12/2007 Sakaguchi ....................... 345/89
2003/0030631 A1 * 2/2003 Chen et al. .................... 345/211
2003/0132906 A1 * 7/2003 Tanaka et al. ................... 345/89
2003/0137526 A1 * 7/2003 Sakaguchi ..................... 345/690
2003/0201959 A1 * 10/2003 Sakaguchi ....................... 345/87
2004/0179027 A1 * 9/2004 Nakai et al. ................... 345/690
2004/0227775 A1 * 11/2004 Shimizu et al. ............... 345/690
2005/0007393 A1 * 1/2005 Akai et al. .................... 345/690
2006/0023001 A1 * 2/2006 Sung et al. .................... 345/690
2006/0192695 A1 * 8/2006 Nishimura ....................... 341/51

* cited by examiner

*Primary Examiner* — Adam J Snyder
(74) *Attorney, Agent, or Firm* — Sughrue Mion, PLLC

(57) ABSTRACT

A grayscale voltage generating circuit includes a first constant-voltage source for generating a high potential; a second constant-voltage source for generating a low potential; γ resistor connected between outputs of the first and second constant-voltage sources; a difference voltage detecting circuit for detecting a difference voltage across the γ resistor; and a voltage-to-current converting circuit for converting the difference voltage to a current by a resistor and outputting the current as a source current and a sink current. The source current output and sink current output of the voltage-to-current converting circuit are connected to the high and low potential sides, respectively, of the γ resistor.

15 Claims, 8 Drawing Sheets

FIG. 4 *Prior Art*

GRAYSCALE VOLTAGE GENERATING CIRCUIT PROVIDING CONTROL OF GRAYSCALE RESISTOR CURRENT

FIELD OF THE INVENTION

This invention relates to a display device and, more particularly, to a circuit for generating grayscale voltage in a liquid crystal display device.

BACKGROUND OF THE INVENTION

An operational amplifier for a grayscale power supply generally has five amplifiers on the positive side and five on the negative side if it is a 6-bit operational amplifier, and nine amplifiers on the positive side and nine on the negative side if it is an 8-bit operational amplifier. These amplifiers are designed to be capable of producing an output up to the vicinity of the power-supply potential or ground potential, taking into consideration the efficiency of the power supply.

Grayscale power supplies are used frequently in special-purpose ICs but there are also cases where they are incorporated in LCD (Liquid Crystal Display) drivers. In such cases there is little leeway in terms of driving capability because the amplifiers are of CMOS construction. Improvements in terms of circuitry, therefore, are required.

FIG. 4 is a diagram illustrating the structure of an ordinary LCD source driver and LCD panel according to the prior art. The LCD source driver includes a data register 1 that accepts digital display signals R, G, B or six bits each; a latch circuit 2 for latching a 6-bit digital signal in sync with a strobe signal ST; a D/A converter 3 comprising N stages of parallel-connected digital/analog converters; a liquid-crystal grayscale voltage generating circuit 4 having a gamma (γ) conversion characteristic that conforms to the characteristic of the liquid crystal; and N-number of voltage followers 5 for buffering voltage from the D/A converter 3.

The LCD panel includes thin-film transistors (TFTs) 6 provided at the intersections of data lines and scanning lines, each transistor having its gate connected to a scanning line and its source connected to a data line; and pixel capacitors 7 having one end connected to the drain of the corresponding TFT and its other end connected to a common terminal COM.

In the LCD panel shown in FIG. 4, N-number of TFTs are provided in each of M-number of rows, although only one row is illustrated in FIG. 4. An LCD gate driver (not shown) drives the gates of the TFTs of each line one after another. The D/A converter 3 converts a 6-bit digital display signal from the latch circuit 2 to analog signals and supplies these to the N-number of voltage followers 5-1 to 5-N. The resultant signals are applied to liquid crystal elements, which act as the pixel capacitors 7-1 to 7-N, via the TFTs 6-1 to 6-N.

Reference voltages are generated by the liquid-crystal grayscale voltage generating circuit 4, and a selection of reference voltage is made by a decoder implemented by a ROM switch (not shown), etc., in the D/A converter 3.

The liquid-crystal grayscale voltage generating circuit 4 incorporates a resistance ladder circuit (not shown). The output is driven by a voltage-follower arrangement in order to lower the impedance of each reference-voltage tap and in order to finely adjust the reference voltage.

FIG. 5 is a diagram illustrating the structure of a liquid-crystal grayscale voltage generating circuit for driving a resistance ladder circuit by a voltage follower (see Japanese Patent Kokai Publication Nos. JP-A-6-348235 and JP-A-10-142582). In FIG. 5, the grayscale voltage generating circuit includes a resistance ladder circuit 10 (resistors R1, R2, . . . , Rn−2, Rn−1) provided internally of an LCD driver; an external resistance ladder circuit 30 (resistors R01', R1', R2', . . . , Rn−2', Rn−1'); a buffer amplifier 20 (operational amplifiers $OP_1$, $OP_2$, . . . , $OP_{n-1}$, $OP_n$) comprising a voltage follower for outputting reference voltages $V_1$ to $V_n$ upon receiving tap voltages from the external resistance ladder circuit 30 as inputs; and a constant-voltage generating circuit 40 ($V_r$). The ladder resistors R01', R1', R2', . . . , Rn−2', Rn−1' of the external resistance ladder circuit 30 are variable resistors and regulate the voltages applied to the operational amplifiers $OP_1$, $OP_2$, . . . , $OP_{n-1}$, $OP_n$ of the buffer amplifier 20. The regulated voltages are adjusted so as to be best suited to the characteristics of the liquid crystal panel.

The reference supply voltages in the liquid-crystal grayscale voltage generating circuit of FIG. 5 are ground potential GND and $V_r$. The reference supply voltage $V_r$ is applied by the stable external constant-voltage generating circuit 40 such as a band-gap reference circuit. Grayscale voltages $V_n$, $V_{n-1}$, $V_{n-2}$, . . . , $V_2$, $V_1$ are finally decided by the ladder resistors R01', R1', R2', . . . , Rn−2', Rn−1'.

More specifically, we have the following:

$$V_n = V_r$$

$$V_{n-1} = V_r\{(Rn-2'+Rn-3'+\ldots+R0')/(Rn-1'+Rn-2'+Rn-3'+\ldots+R0')\}$$

Similarly, $$V_1 = V_r\{R0'/(Rn-1'+Rn-2'+Rn-3'+\ldots+R0')\}$$

If each resistance ratio of the ladder resistors R1, R2, . . . , Rn−2, Rn−1 that decide the grayscale voltages internally and each resistance ratio of the ladder resistors R01', R1', R2', . . . , Rn−2', Rn−1' that decide the grayscale voltages externally are the same, then the output currents of the operational amplifiers $OP_2$, $OP_3$, . . . , $OP_n$−1 will be zero.

However, the output current $I_n$ of an nth operational amplifier $OP_n$ (the operational amplifier whose output has the highest potential) counting from the ground side is given by Equation (1) below in the source direction.

$$I_n = (V_n - V_1)/(R1+R2+\ldots+Rn-1) = I_0 \quad (1)$$

The output current $I_1$ of the first operational amplifier $OP_1$ (the operational amplifier whose output has the lowest potential) counting from the ground side is given by Equation (2) below in the sink direction.

$$I_1 = (V_n - V_1)/(R1+R2+\ldots+Rn-1) = I_0 \quad (2)$$

Thus, a problem which arises in the liquid-crystal grayscale voltage generating circuit shown in FIG. 5 is that the output dynamic range of the operational amplifiers $OP_n$, $OP_1$ diminishes owing to the source-direction output current $I_n$ of operational amplifier $OP_n$ and sink-direction output current I1 of operational amplifier $OP_1$ indicated by Equations (1) and (2).

In order to solve this problem, the applicant proposes arrangements of the kind shown in FIGS. 6A, 6B or in FIGS. 7A, 7B in Japanese Patent Application Kokai Publication No. JP-A-10-142582.

Specifically, as shown for example in FIG. 6A, an auxiliary resistor Rn is connected between a high-voltage power-supply terminal $V_{DD}$ and ladder resistor Rn−1, and an auxiliary resistor R0 is connected between a low-voltage power-supply terminal GND and ladder resistor R1. Other components are similar to those shown in FIG. 5. By virtue of such an arrangement, source current of the voltage follower $OP_n$ on the side of the high-voltage power-supply terminal $V_{DD}$ is adjusted by the resistor Rn, and sink current of the voltage follower $OP_1$ on the low-voltage power-supply terminal GND is adjusted by the resistor R0. It should be noted that FIG. 6B is constructed by removing the resistor Rn/2 in the internal resistance ladder of FIG. 6A.

Further, as illustrated in FIG. 7A, auxiliary current sources $I_0$, In are connected instead of the auxiliary resistors R0, Rn. Here it is assumed that the auxiliary current sources $I_0$, $I_n$ are set so as to satisfy Equations (1), (2). According to this arrangement, the source current and sink current of the operational amplifiers $OP_n$, $OP_1$ become zero, the output dynamic range is broadened and it is easier to design the output stages of these operational amplifiers. It should be noted that FIG. 7B is constructed by removing the resistor Rn/2 in the internal resistance ladder of FIG. 7A.

FIG. 8 illustrates the connections between buffer operational amplifiers $A_H$, $A_L$, which construct the grayscale power-supply circuit, and γ resistors (grayscale resistors for γ adjustment) of a plurality of LCD drivers. Wiring resistors serving as parasitic resistance of wiring connecting the plurality of LCD drivers are shown in FIG. 8 in terms of a circuit diagram. That is, γ resistors from the first LCD driver to the nth LCD driver are connected in parallel. Furthermore, nodes connected to the maximum and minimum potentials of the γ resistors are connected to the outputs of the buffer operational amplifiers, but parasitic resistance components (wiring resistances are produced in the wiring connecting the γ resistors in parallel.

As shown in FIG. 8, wiring resistance components are produced in regular order, namely between the γ resistor of the first LCD driver (first driver) and the γ resistor of the second LCD driver (second driver), . . . , and between the γ resistor of the (n+1)th LCD driver and the γ resistor of the nth LCD driver (nth driver).

Thus, in the conventional LCD drivers, adopting the implementations of FIGS. 6A, 6B and 7A, 7B has the effect of widening output dynamic range and facilitating the designing of the output stages of the operational amplifiers. However, the ordinary LCD driver is not used only at a certain constant voltage that has been decided, and in most cases the voltage value used differs for every manufacturer of LCD modules. In general, therefore, a certain range of voltages (e.g., $V_{DD2}$: 8 to 13.5V) is stipulated in the specifications of LCD drivers and operation within this range of power-supply voltages is assured.

Thus, if the power-supply voltage is subjected to variations, then the current that flows into the γ resistors also varies as a matter of course. As a consequence, the value of the constant-current auxiliary current source connected to the γ resistors and the value of the current that flows into the γ resistors will not exactly coincide.

This means that the difference between the value of the constant-current auxiliary current source connected to the γ resistors and the value of the current that flows into the γ resistors flows into the output of the operational amplifier connected to the side of the highest potential or to the side of the lowest potential (if the difference current value is zero, no current flows into the output of the operational amplifier, as described above). Thus, there is only one point of a certain power-supply voltage where the output current of the operational amplifier for the grayscale power supply becomes zero.

For example, in a COG (Chip On Glass) panel-type device of recent interest, the above-mentioned wiring resistance component becomes as large as several hundred ohms at times. If wiring of γ resistors is performed under this condition, then, in the event that the output currents of the operational amplifiers $A_H$, $A_L$ for the grayscale power supply are not zero, the γ characteristic of each LCD driver will differ owing to voltage drops caused by the output currents of the operational amplifiers $A_H$, $A_L$ of the wiring resistors. This causes a display problem referred to as "block unevenness".

In the case of a COG device, wiring resistance is great and the wiring resistance components between the γ resistors of the LCD drivers shown in FIG. 8 are so large that they cannot be ignored.

SUMMARY OF THE INVENTION

Accordingly, an object of the present invention is to solve the problems that arise in the prior art.

A grayscale voltage generating circuit according to the present invention comprises a grayscale resistor (γ resistor); two driving amplifiers for deciding potentials at both ends of the grayscale resistor; a difference voltage detecting circuit for detecting a difference voltage across the grayscale resistor; and a voltage-to-current converting circuit for converting the detected difference voltage to current; wherein source current of the current-to-voltage converting circuit is connected to the high potential side of the grayscale resistor and sink current is connected to the low potential side of the grayscale resistor.

More specifically, according to a first aspect of the present invention, the foregoing object is attained by providing a grayscale voltage generating circuit comprising: a first voltage source for outputting a first voltage; a second voltage source for outputting a second voltage having a potential lower than that of the first voltage; a grayscale resistor having a first end and a second end connected to an output end of the first voltage source and to an output end of the second voltage source, respectively; and a circuit for detecting a difference voltage across both ends of the grayscale resistor, converting the difference voltage to an output current of a current value that corresponds to the difference voltage and outputting the current from first and second output terminals as a source current and a sink current, respectively; wherein the first and second output terminals that output the source current and the sink current, respectively, are connected to the first and second ends of the grayscale resistor, respectively.

The first voltage source in this aspect of the invention may include a first voltage follower that receives the first voltage as an input for driving an output terminal of the first voltage source by the first voltage; and the second voltage source in this aspect of the invention includes a second voltage follower that receives the second voltage as an input for driving an output terminal of the second voltage source by the second voltage.

According to another aspect of the present invention, the foregoing object is attained by providing a grayscale voltage generating circuit comprising: a first constant-voltage source for generating a voltage on the side of a high potential; a second constant-voltage source for generating a voltage on the side of a low potential; a grayscale resistor having a first end and a second end connected to an output of the first constant-voltage source and to an output end of the second constant-voltage source, respectively; a difference voltage detecting circuit for detecting a difference voltage across both ends of the grayscale resistor; and a voltage-to current converting circuit for converting the difference voltage to a current and outputting the current as a source current and a sink current; wherein output of the source current and output of the sink current of the voltage-to-current converting circuit are connected to the high potential side and to the low potential side, respectively, of the grayscale resistor.

The grayscale voltage generating circuit in this aspect of the invention further includes a first voltage follower circuit that receives the output voltage of the first constant-voltage source as an input and has an output connected to the first end of the grayscale resistor; and a second voltage follower circuit that receives the output voltage of the second constant-voltage source as an input and has an output connected to the second end of the grayscale resistor.

The first and second constant-voltage sources and the first and second voltage follower circuits in this aspect of the invention are provided externally of a driver, such as an LCD driver, that drives a display panel, and the grayscale resistor, difference voltage detecting circuit and voltage-to-current converting circuit are provided internally of the driver. Alternatively, the first and second constant-voltage sources are provided externally of a driver that drives a display panel, and the first and second voltage follower circuits, grayscale resistor, difference voltage detecting circuit and voltage-to-current converting circuit are provided internally of the driver.

Further, according to the present invention, there is provided a grayscale voltage generating circuit comprising: a first operational amplifier of voltage-follower construction having a non-inverting input terminal connected to a first constant-voltage source that generates a voltage on a high potential side and an inverting input terminal connected to an output terminal; a second operational amplifier having a non-inverting input terminal connected to a second constant-voltage source that generates a voltage on a low potential side and an inverting input terminal connected to an output terminal; a grayscale resistor connected between the output terminal of the first operational amplifier and the output terminal of the second operational amplifier; a difference voltage detecting circuit for detecting a difference voltage across the grayscale resistor; and a voltage-to current converting circuit for converting the difference voltage to a current and outputting the current as a source current and a sink current; wherein output of the source current and output of the sink current of the voltage-to-current converting circuit are connected to the high potential side and low potential side, respectively, of the grayscale resistor.

In the grayscale voltage generating circuit according to the present invention, the difference voltage generating circuit and the voltage-to-current converting circuit include: a first operational amplifier having an inverting input terminal connected to the output terminal of the first voltage source; a second operational amplifier having a non-inverting input terminal connected to the output terminal of the second voltage source; a first MOS transistor of a first conductivity type having a gate connected to an output terminal of the first operational amplifier, a drain connected to a non-inverting input terminal of the first operational amplifier and a source connected to a first power supply; a second MOS transistor of the first conductivity type having a gate and a source connected to a gate and the source, respectively, of the first MOS transistor, and a drain connected to the first end of the grayscale resistor; a third MOS transistor of a second conductivity type having a drain connected to a non-inverting input terminal of the second operational amplifier and a source connected to a second power supply; a fourth MOS transistor of the second conductivity type having a gate and a source connected to the gate and source, respectively, of the third MOS transistor, and a drain connected to the second end of the grayscale resistor; and a voltage-to-current converting resistor connected between the non-inverting input terminal of the first operational amplifier and the non-inverting input terminal of the second operational amplifier.

The meritorious effects of the present invention are summarized as follows.

In accordance with the present invention, even if the power-supply voltage fluctuates, the current that flows into grayscale resistors is detected reliably and the grayscale resistors are supplemented with current so that there is almost no output current from the voltage-follower amplifier that supplies the grayscale voltage. As a result, a voltage drop ascribable to parasitic capacitance between LCD drivers of a plurality of LCD drivers does not occur and it is possible to prevent a decline in image quality caused by so-called block unevenness.

PREFERRED EMBODIMENTS OF THE INVENTION

Figure 1:
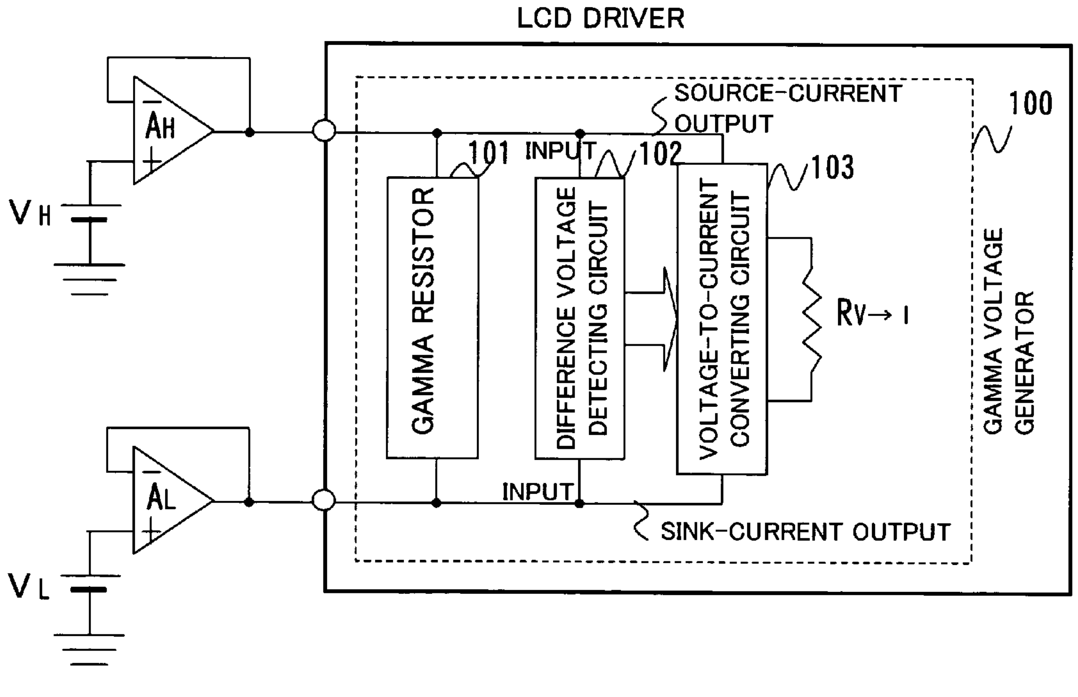
FIG. 1 is a block diagram illustrating the structure of a grayscale voltage generating circuit according to an embodiment of the present invention.

The present invention will be described in detail with reference to the accompanying drawings.

A grayscale voltage generating circuit according to the present invention comprises a first constant-voltage source ($V_H$) for generating a high potential; a second constant-voltage source ($V_L$) for generating a low potential; γ resistor (101) connected between the constant-voltage source ($V_H$) and the constant-voltage source ($V_L$); a difference voltage detecting circuit (102) for detecting a difference voltage across the γ resistor; and a voltage-to-current converting circuit (103) for converting the difference voltage to a current by a resistor and outputting the current as a source current and a sink current. The source current output and sink current output of the voltage-to-current converting circuit (103) are connected to the high potential side and to the low potential side, respectively, of the γ resistor (101).

Further, a grayscale voltage generating circuit according to the present invention comprises a voltage-follower-connected first operational amplifier having a non-inverting input terminal connected to a constant-voltage source $V_H$ that generates a high potential and an inverting input terminal connected to an output terminal; a second voltage-follower-connected operational amplifier having a non-inverting input terminal connected to a constant-voltage source $V_L$ that generates a low potential and an inverting input terminal connected to an output terminal; a γ resistor connected between the output of the first operational amplifier and the output of the second operational amplifier; a difference voltage detecting circuit for detecting a difference voltage between the constant-voltage source $V_H$ and the constant-voltage source $V_L$; and a voltage-to current converting circuit for receiving the detection voltage of the difference voltage detecting circuit, converting the voltage to a current and outputting the current as a source current and a sink current.

For the grayscale on the negative side, the difference voltage detecting circuit and voltage-to-current converting circuit include a first operational amplifier ($OP_{L1}$) having an inverting input terminal connected to first constant-voltage source $V_{-H}$; a second operational amplifier ($OP_{L2}$) having an inverting input terminal connected to a second constant-voltage source $V_{-L}$; a P-channel MOS transistor (Q3) having a gate connected to the output terminal of the first operational amplifier ($OP_{L1}$), a drain connected to a non-inverting input terminal of the first operational amplifier ($OP_{L1}$) and a source connected to a first power supply ($V_{DD}$); a P-channel MOS transistor (Q4) having a gate and a source connected to the gate and the source, respectively, of the P-channel MOS transistor (Q3), and a drain connected to a first end of a γ resistor [R1, R2, . . . , R(n/2)−1]; an N-channel MOS transistor (Q1) having a drain connected to a non-inverting input terminal of the second operational amplifier ($OP_{L2}$) and a source connected to a second power supply ($V_{SS}$); an N-channel MOS transistor (Q2) having a gate and a source connected to the gate and the source, respectively, of the N-channel MOS transistor (Q1), and a drain connected to a second end of the γ resistor [R1, R2, . . . , R(n/2)−1]; and a voltage-to-current converting resistor ($R_-$) connected between the non-inverting input terminal of the first operational amplifier ($OP_{L1}$) and the non-inverting input terminal of the second operational amplifier ($OP_{L2}$). The transistors Q3 and Q4 form the input and output sides of a current mirror. A mirror current of a current that flows into the transistor Q3 [a current that flows into the voltage-to-current converting resistor ($R_-$)] is supplied from the drain of the transistor Q4 to the high potential side of the γ resistor [R1, R2, . . . , R(n/2)−1] as a source current. The transistors Q1 and Q2 form the input and output sides of a current mirror. A mirror current of a current that flows into the transistor Q1 [a current that flows into the voltage-to-current converting resistor ($R_-$)] is supplied from the drain of the transistor Q1 to the low potential side of the γ resistor [R1, R2, . . . , R(n/2)−1] as a sink current.

Similarly, for the grayscale on the positive side, the difference voltage detecting circuit and voltage-to-current converting circuit include a first operational amplifier ($OP_{H1}$) having an inverting input terminal connected to a first constant-voltage source $V_{+H}$; a second operational amplifier ($OP_{H2}$) having an inverting input terminal connected to a second constant-voltage source $V_{+L}$; a P-channel MOS transistor (Q7) having a gate connected to the output terminal of the first operational amplifier ($OP_{H1}$), a drain connected to a non-inverting input terminal of the first operational amplifier ($OP_{H1}$) and a source connected to a first power supply ($V_{DD}$); a P-channel MOS transistor (Q8) having a gate and a source connected to the gate and the source, respectively, of the P-channel MOS transistor (Q7), and a drain connected to a first end of a γ resistor [R(n/2)+1, . . . , Rn−2, Rn−1]; an N-channel MOS transistor (Q5) having a drain connected to a non-inverting input terminal of the second operational amplifier ($OP_{H2}$) and a source connected to a second power supply ($V_{SS}$); an N-channel MOS transistor (Q6) having a gate and a source connected to the gate and the source, respectively, of the N-channel MOS transistor (Q5), and a drain connected to a second end of the γ resistor [R(n/2)+1, . . . , Rn−2, Rn−1]; and a voltage-to-current converting resistor ($R_+$) connected between the non-inverting input terminal of the first operational amplifier ($OP_{H1}$) and the non-inverting input terminal of the second operational amplifier ($OP_{H2}$). The transistors Q7 and Q8 form the input and output sides of a current mirror. A mirror current of a current that flows into the transistor Q7 [a current that flows into the voltage-to-current converting resistor ($R_+$)] is supplied from the drain of the transistor Q8 to the high potential side of the γ resistor [R(n/2)+1, . . . , Rn−2, Rn−1] as a source current. The transistors Q5 and Q6 form the input and output sides of a current mirror. A mirror current of a current that flows into the transistor Q5 [a current that flows into the voltage-to-current converting resistor ($R_+$)] is supplied from the drain of the transistor Q6 to the low potential side of the γ resistor [R(n/2)+1, . . . , Rn−2, Rn−1] as a sink current.

In the present invention, a current that flows into a γ resistor incorporated in each LCD driver is detected, a current that is exactly the same as this current is generated within the LCD driver circuit and is supplied to the γ resistor. As a result, an operational amplifier for a grayscale power supply that drives the γ resistor no longer need drive a current. If γ resistors are connected together in a case where a plurality of LCD drivers are used, therefore, a current will no flow between these resistors and a voltage drop ascribable to wiring resistance will not occur. By virtue of such an arrangement, it is possible to provide a circuit that is free of the display problem referred to as block unevenness. Embodiments of the invention will now be described.

FIG. 1 is a block diagram illustrating the structure of a grayscale voltage generating circuit according to an embodiment of the present invention. FIG. 1 illustrates an arrangement in which the driving amplifiers of the grayscale power supply are provided externally of the LCD driver. In this embodiment, as shown in FIG. 1, circuitry that is external to the LCD driver is formed by a constant-voltage source $V_H$ for generating a high potential; a voltage-follower-connected driving amplifier (differential amplifier) $A_H$ that receives the constant-voltage source $V_H$ at a non-inverting input terminal and that has an inverting input terminal connected to its output terminal; a constant-voltage source $V_L$ for generating a high potential; and a voltage-follower-connected driving amplifier (differential amplifier) $A_L$ that receives the constant-voltage source $V_L$ at a non-inverting input terminal and that has an inverting input terminal connected to its output terminal.

The LCD driver of this embodiment has a γ voltage generator 100 (grayscale voltage generator) that includes a γ resistor (grayscale resistor) 101 comprising a resistor string connected between the driving amplifier AH and driving amplifier AL; a difference voltage detecting circuit 102 for detecting the voltage difference across the γ resistor 101; and a voltage-to-current converting circuit 103 for converting the difference voltage to a current by a resistor $R_{V\rightarrow I}$ and delivering the current output as a source current and a sink current.

The source-current output of the voltage-to-current converting circuit 103 is connected to the high potential side of the γ resistor 101, and the sink-output current is connected to the low potential side of the γ resistor 101.

Figure 2:
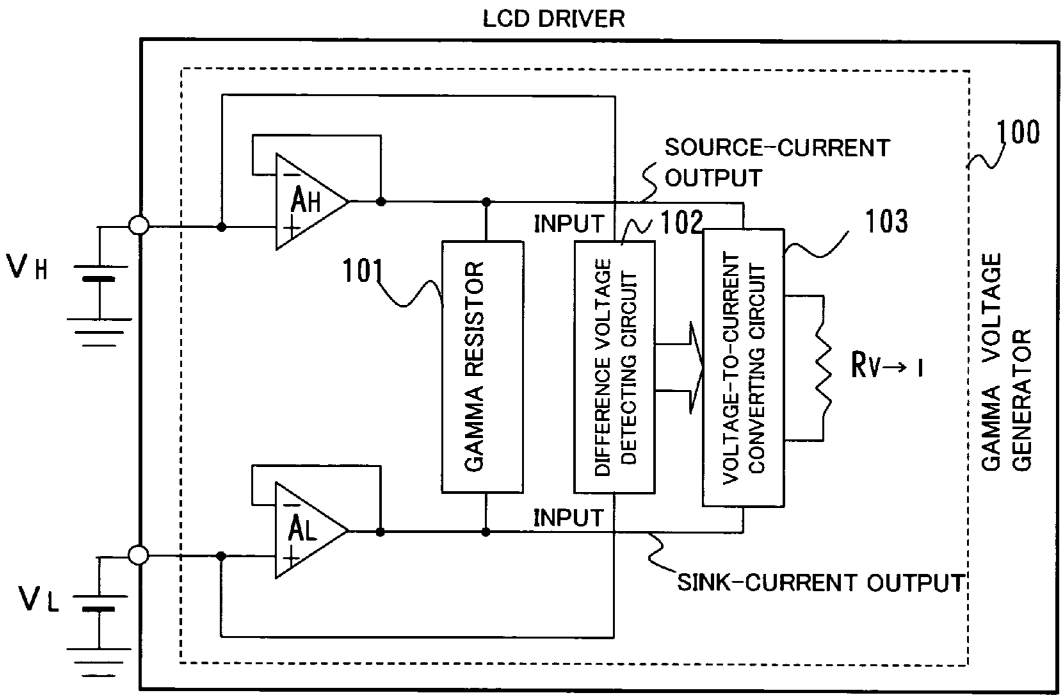
FIG. 2 is a block diagram illustrating the structure of another grayscale voltage generating circuit according to an embodiment of the present invention.

In FIG. 1, the driving amplifiers $A_H$, $A_L$ of the grayscale power supply are provided external to the LCD driver. However, it goes without saying that the present invention is not limited to such an arrangement. FIG. 2 is a diagram illustrating an example of an arrangement in which the driving amplifiers $A_H$, $A_L$ of the grayscale power supply are incorporated within the LCD driver. As shown in FIG. 2, the constant-voltage source $V_H$ for generating the high potential and the constant-voltage source $V_L$ for generating the low potential are provided externally as the grayscale power supply of the LCD driver. Provided within the LCD driver are two voltage-follower-connected driving amplifiers $A_H$ and $A_L$ having their non-inverting input terminals connected to the constant-voltage sources $V_H$ and $V_L$, respectively; difference voltage detecting circuit 102 having its input terminals connected to the two constant-voltage sources $V_H$ and $V_L$ for outputting a difference voltage; and voltage-to-current converting circuit 103 for converting the difference voltage to a current by resistor $R_{V\rightarrow I}$ and outputting the current as both a source current and a sink current. The source-current output of the voltage-to-current converting circuit 103 is connected to the high potential side of the γ resistor 101, and the sink-output current is connected to the low potential side of the γ resistor 101.

The operation of the embodiment shown in FIGS. 1 and 2 will now be described. The circuits shown in FIGS. 1 and 2 operate in the same manner.

Let RT represent the total resistance value across the γ resistor 101, which is illustrated as a single block. Since the constant-voltage source $V_H$ and the constant-voltage source $V_L$ are connected to respective ends of the γ resistor 101, a current Iγ that flows into the γ resistor 101 is given by Equation (3) below.

$$I\gamma=(V_H-V_L)/RT \tag{3}$$

The difference voltage detecting circuit 102 detects the difference voltage (=$V_H$−$V_L$) between the constant-voltage source $V_H$ and constant-voltage source $V_L$ and the voltage-to-current converting circuit 103 converts the difference voltage (=$V_H$−$V_L$) to a current by the resistor $R_{V\rightarrow I}$. That is, the voltage-to-current converting circuit 103 produces an output voltage $I_{out}$ given by Equation (4) below.

$$I_{out}=(V_H-V_L)/R_{V\rightarrow I} \tag{4}$$

The voltage-to-current converting circuit 103 has a source-current output and a sink-current output that have the current value $I_{out}$. The source-current output is connected to the high potential side of the γ resistor 101, and the sink-current output is connected to the low potential side of the γ resistor 101.

Accordingly, if the following holds:

$$RT=R_{V\rightarrow I} \tag{5}$$

then we have the following:

$$I\gamma=I_{out} \tag{6}$$

By making the total resistance value RT of the γ resistor 101 equal to the resistance $R_{V\rightarrow I}$ of the voltage-to-current converting circuit 103, the current Iγ that flows into the γ resistor 101 becomes equal to the output current $I_{out}$ (the current value of the source current and of the sink current) of the voltage-to-current converting circuit 103.

That is, the current that flows into the γ resistor 101 flows out of, and is drawn in from, the voltage-to-current converting circuit 103 in its entirety. This means that no current flows into the outputs of the two driving amplifiers $A_H$ and $A_L$ and that it will suffice to merely supply voltage.

Further, as an example of application of the present invention, it is possible to raise the resistance value of the resistance $R_{V\rightarrow I}$ in order to reduce the current consumed. For instance, in the example described above, if a resistance value that is k times the resistance $R_{V\rightarrow I}$ (i.e., $kR_{V\rightarrow I}$) is used, the same effects are obtained as a result by likewise multiplying the coefficients for the conversion to the current value by a factor of k. This is represented by Equation (7) below, which shows that an identical result is obtained.

$$\begin{aligned} I_{out} &= k(V_H - V_L)/kR_{V\rightarrow I} \\ &= (V_H - V_L)R_{V\rightarrow I} \end{aligned} \tag{7}$$

Figure 3:
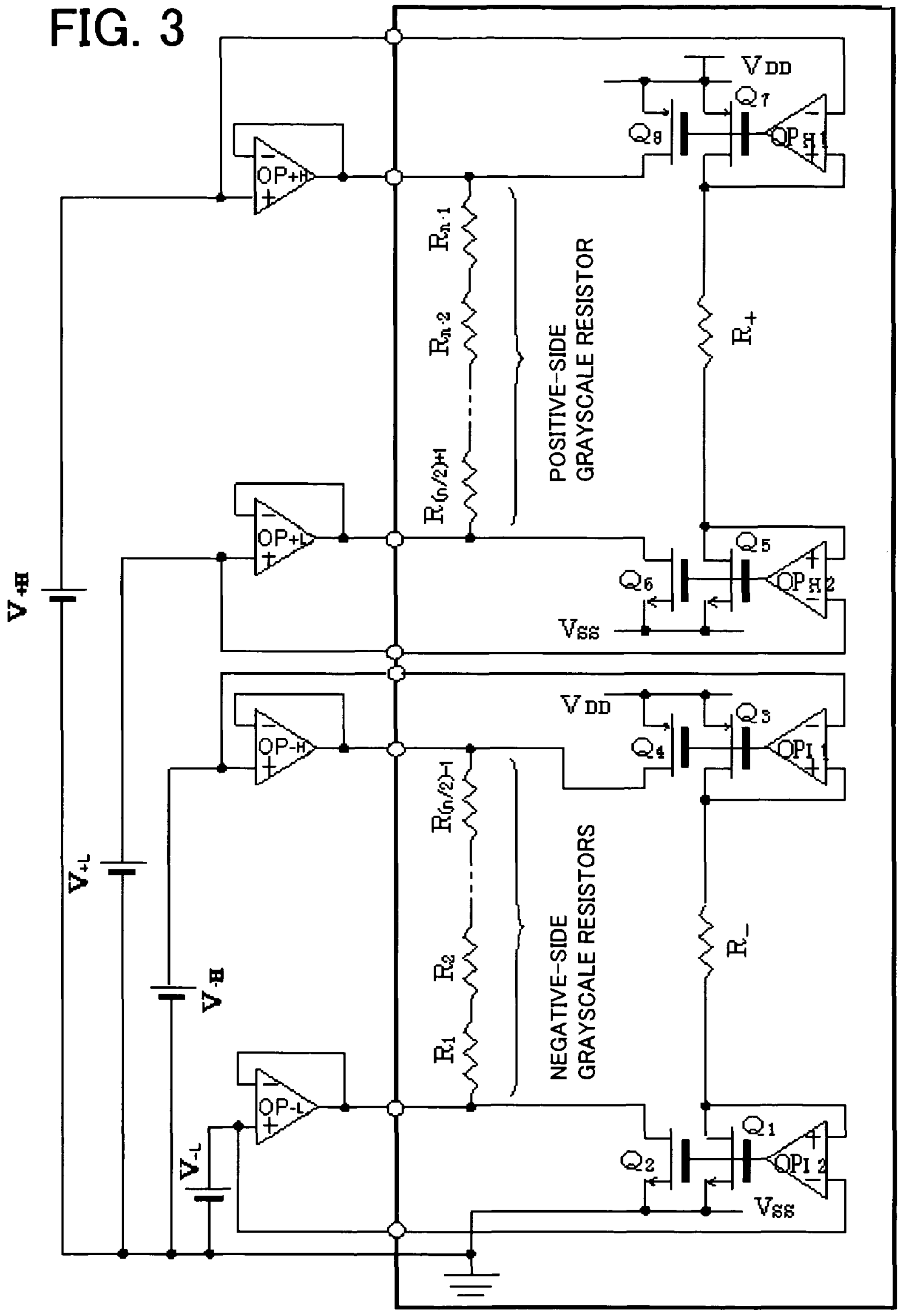
FIG. 3 is a circuit diagram illustrating the circuit structure of the grayscale voltage generating circuit according to the embodiment.
Figure 4:
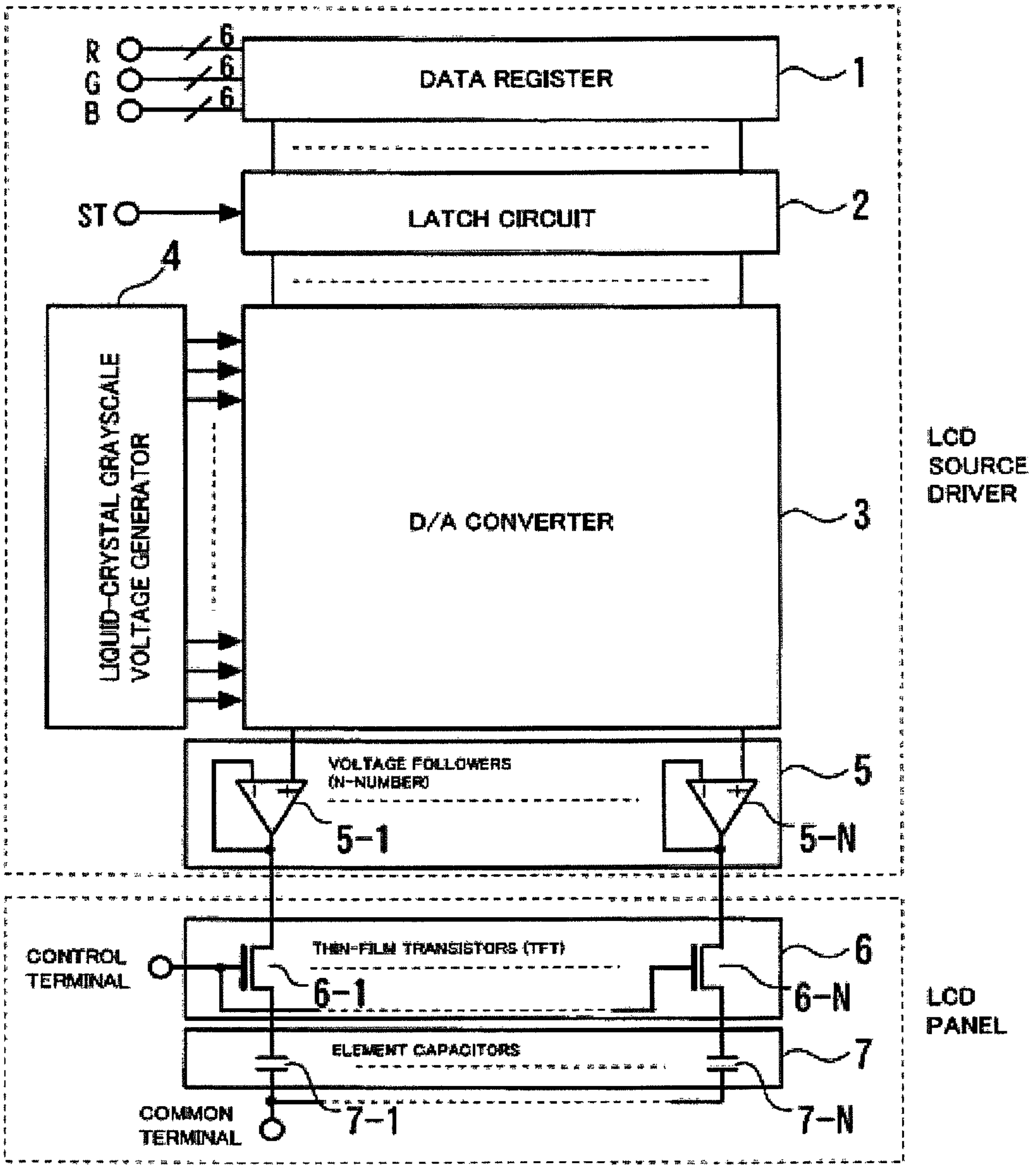
FIG. 4 is a block diagram illustrating an ordinary liquid crystal display device.
Figure 5:
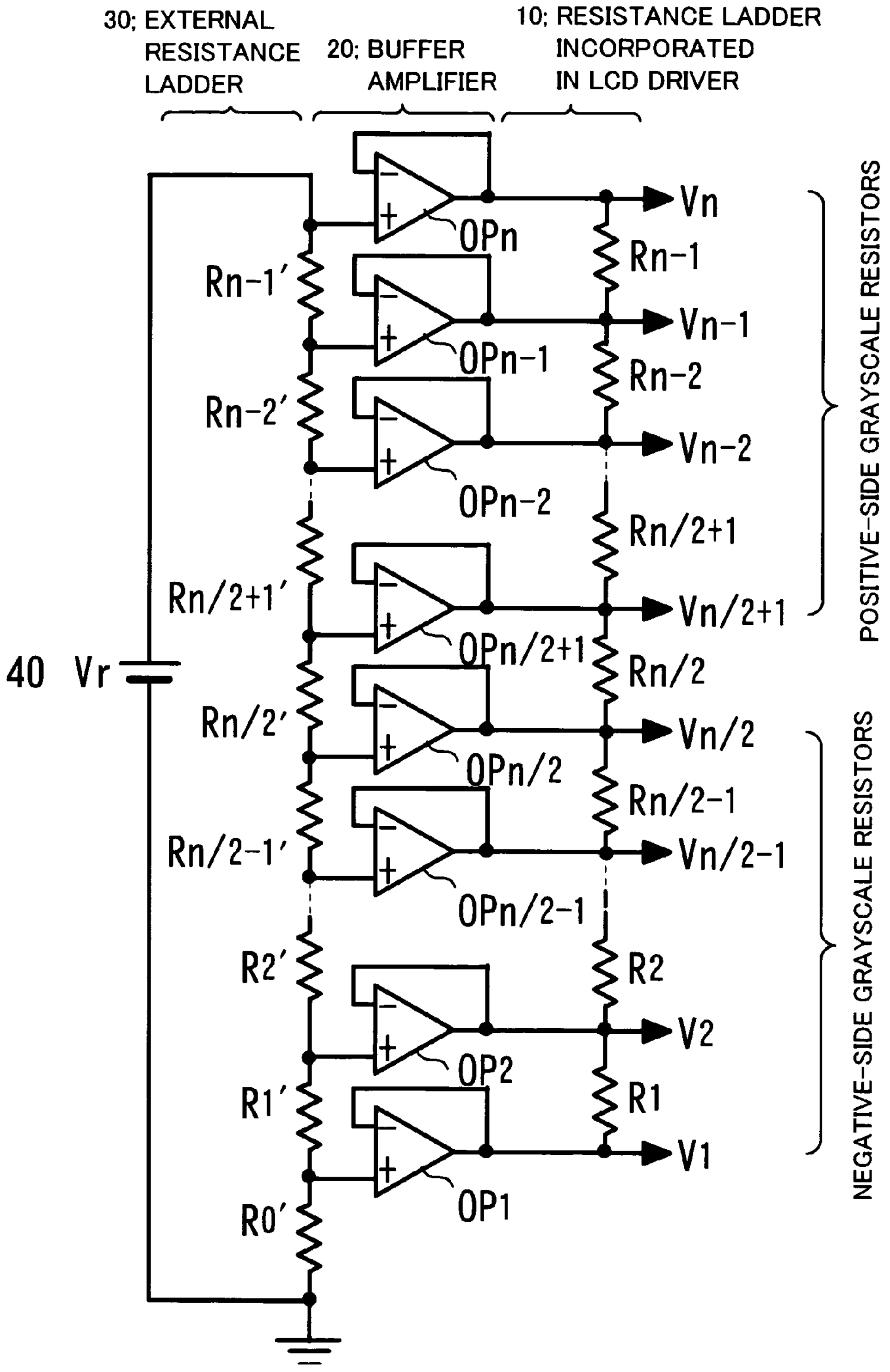
FIG. 5 PRIOR ART
FIG. 5 is a circuit diagram illustrating a liquid crystal grayscale voltage generating circuit according to the prior art.
Figure 6A:
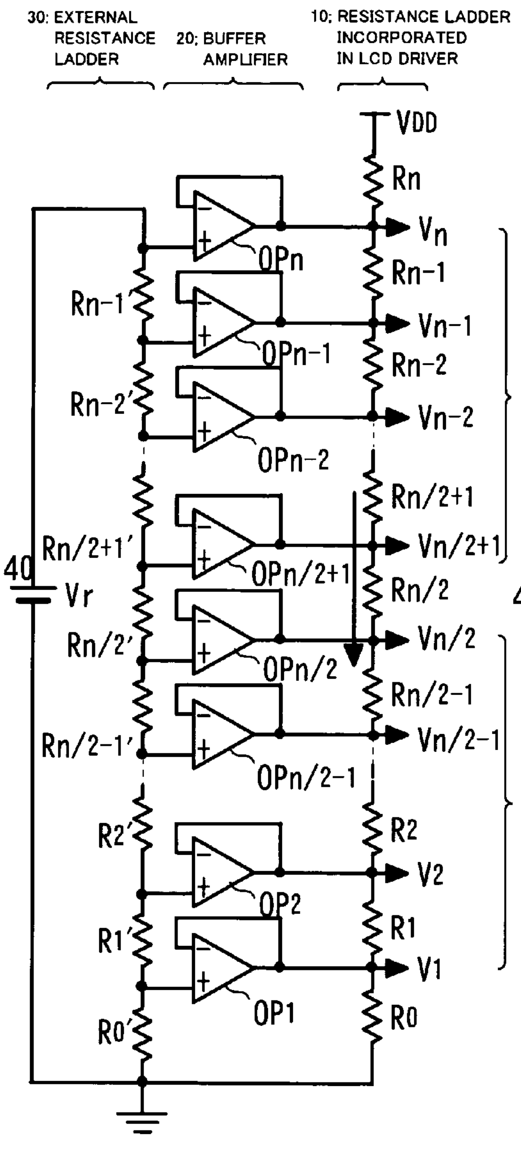
FIG. 6A PRIOR ART
FIGS. 6A and 6B are circuit diagrams illustrating other examples of a liquid crystal grayscale voltage generating circuit according to the prior art.
Figure 6B:
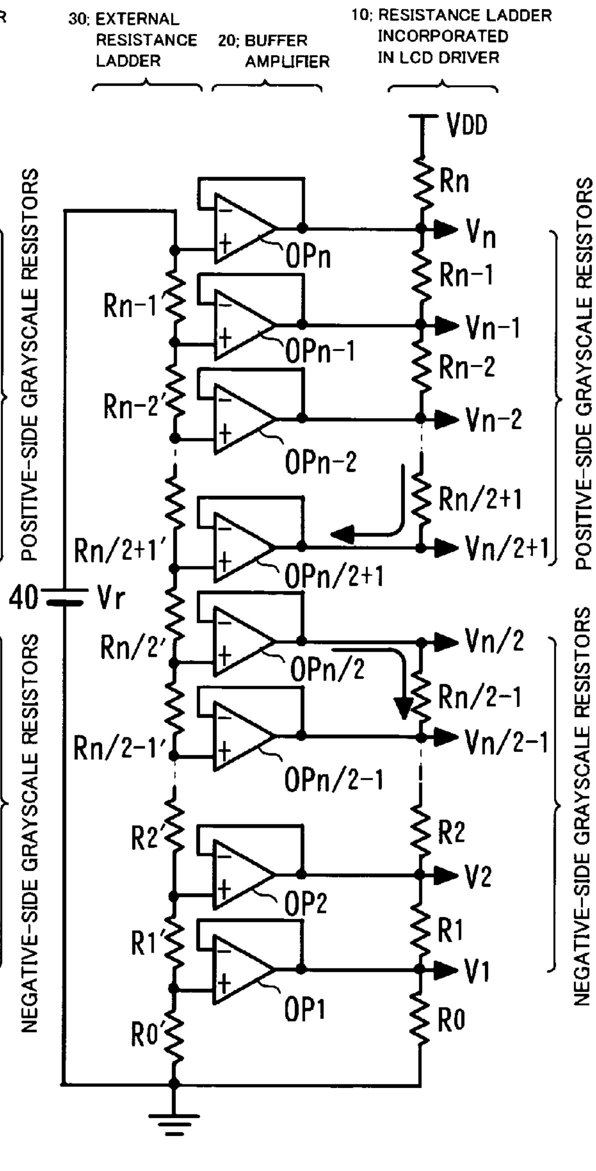
FIG. 6B PRIOR ART
Figure 7A:
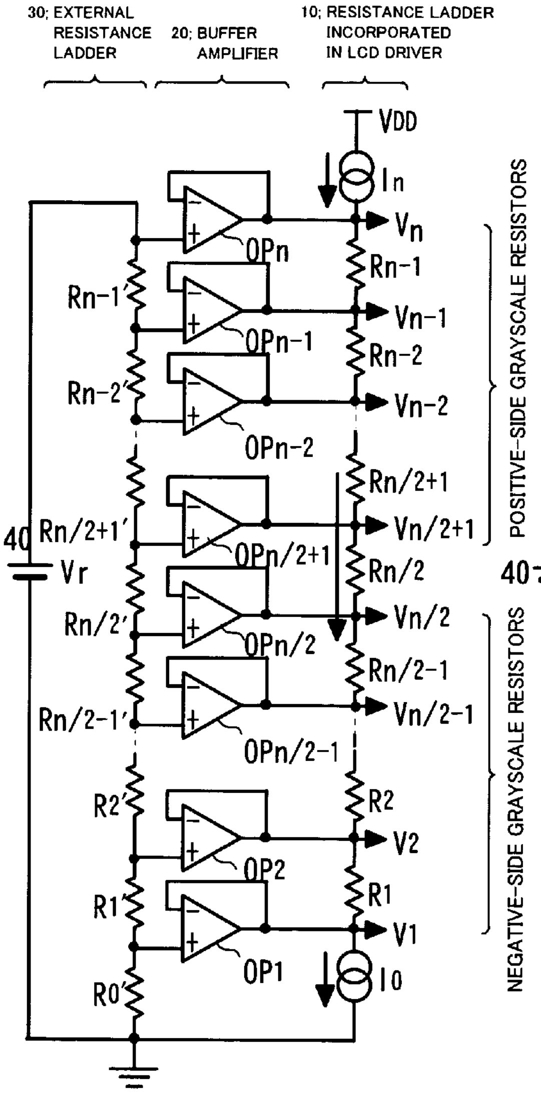
FIG. 7A PRIOR ART
FIGS. 7A and 7B are circuit diagrams illustrating other examples of a liquid crystal grayscale voltage generating circuit according to the prior art.
Figure 7B:
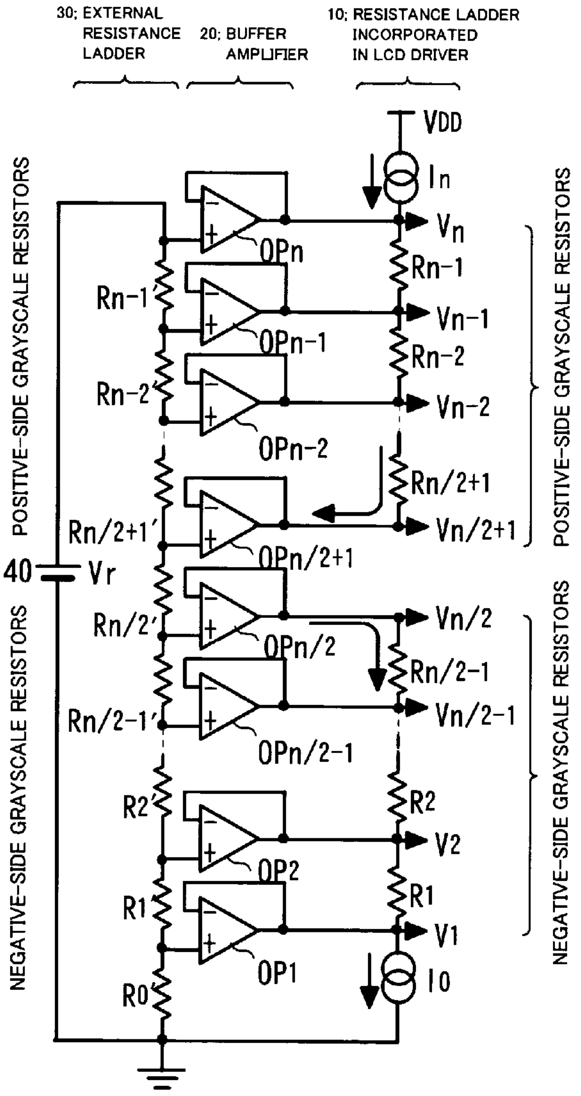
FIG. 7B PRIOR ART
Figure 8:
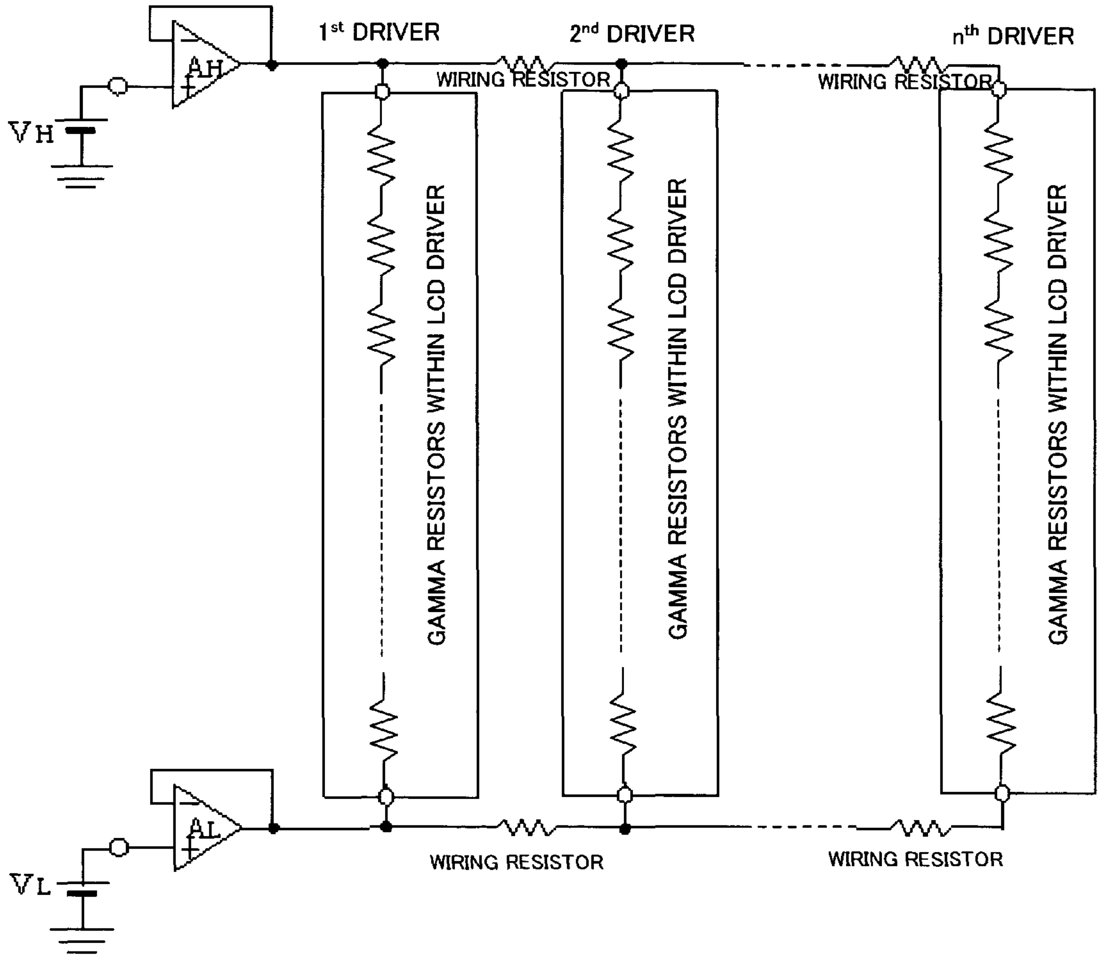
FIG. 8 PRIOR ART
FIG. 8 is an equivalent circuit diagram illustrating wiring resistors in a case where a plurality of LCD drivers are connected according to the prior art.

FIG. 3 is a diagram in which the arrangement illustrated as a block diagram in FIG. 1 is exemplified in the form of specific circuitry.

With reference to FIG. 3, the LCD driver is provided with the following externally: a constant-voltage source $V_{+H}$ for deciding the potential on the high potential side of a positive-side grayscale voltage; a constant-voltage source $V_{+L}$ for deciding the potential on the low potential side of the positive-side grayscale voltage; a constant-voltage source $V_{-H}$ for deciding the potential on the high potential side of a negative-side grayscale voltage; a constant-voltage source $V_{-L}$ for deciding the potential on the low potential side of the negative-side grayscale voltage; a voltage-follower-connected operational amplifier $OP_{+H}$ having a non-inverting input terminal connected to the constant-voltage source $V_{+H}$; a voltage-follower-connected operational amplifier $OP_{+L}$ having a non-inverting input terminal connected to the constant-voltage source $V_{+L}$; a voltage-follower-connected operational amplifier $OP_{-H}$ having a non-inverting input terminal connected to the constant-voltage source $V_{-H}$; and a voltage-follower-connected operational amplifier $OP_{-L}$ having a non-inverting input terminal connected to the constant-voltage source $V_{-L}$.

The LCD driver has a group of serially-connected positive-side grayscale resistors R(n/2)+1 to Rn−1 connected between the output of the operational amplifier $OP_{+H}$ and the output of the operational amplifier $OP_{+L}$, and a group of serially-connected negative-side grayscale resistors R1 to R(n/2)−1 connected between the output of the operational amplifier $OP_{-H}$ and the output of the operational amplifier $OP_{-L}$. The LCD driver further includes operational amplifiers $OP_{H1}$, $OP_{H2}$, $OP_{L1}$, $OP_{L2}$; N-channel MOS transistors Q1, Q2, Q5, Q6; P-channel MOS transistors Q3, Q4, Q7, Q8; and resistors $R_+$, $R_-$.

The operational amplifiers $OP_{H1}$, $OP_{H2}$ have their inverting input terminals connected to constant-voltage sources $V_{+H}$ and $V_{+L}$, respectively. The operational amplifiers $OP_{L1}$, $OP_{L2}$ have their inverting input terminals connected to constant-voltage sources $V_{-H}$ and $V_{-L}$, respectively.

The N-channel MOS transistor Q1 has a gate connected to the output terminal of the operational amplifier $OP_{L2}$, a drain connected to the non-inverting input terminal of the operational amplifier $OP_{L2}$ and a source connected to the negative power supply $V_{SS}$.

The N-channel MOS transistor Q2 has a gate and source connected to the gate and source, respectively, of the N-channel MOS transistor Q1, and a drain connected to the output of the voltage-follower amplifier $OP_{-L}$.

The P-channel MOS transistor Q3 has a gate connected to the output terminal of the operational amplifier $OP_{L1}$, a drain connected to the non-inverting input terminal of the operational amplifier $OPL_1$ and a source connected to the positive power supply $V_{DD}$.

The P-channel MOS transistor Q4 has a gate and source connected to the gate and source, respectively, of the P-channel MOS transistor Q3, and a drain connected to the output of the voltage-follower amplifier $OP_{-H}$.

The N-channel MOS transistor Q5 has a gate connected to the output terminal of the operational amplifier $OP_{Hs}$, a drain connected to the non-inverting input terminal of the operational amplifier $OP_{H2}$ and a source connected to the negative power supply $V_{SS}$.

The N-channel MOS transistor Q6 has a gate and source connected to the gate and source, respectively, of the N-channel MOS transistor Q5, and a drain connected to the output of the voltage-follower amplifier $OP_{+L}$.

The P-channel MOS transistor Q7 has a gate connected to the output terminal of the operational amplifier $OP_{H1}$, a drain connected to the non-inverting input terminal of the operational amplifier $OP_{H1}$ and a source connected to the positive power supply $V_{DD}$.

The P-channel MOS transistor Q8 has a gate and source connected to the gate and source, respectively, of the P-channel MOS transistor Q7, and a drain connected to the output of the voltage-follower amplifier $OP_{+H}$.

The resistor R_ has a first end connected to the drain of the N-channel MOS transistor Q1 and a second end connected to the drain of the P-channel MOS transistor Q3. The resistance value of this resistor is equal to the total of the resistance values of the negative-side grayscale-resistor group R1 to R(n/2)−1.

The resistor $R_+$ has a first end connected to the drain of the N-channel MOS transistor Q5 and a second end connected to the drain of the P-channel MOS transistor Q7. The resistance value of this resistor is equal to the total of the resistance values of the positive-side grayscale-resistor group R(n/2)+1 to Rn−1.

The operation of the circuit shown in FIG. 3 will now be described.

If the operational amplifiers $OP_{-H}$, $OP_{-L}$ are ideal, currents $I_{R1\ to\ R(n/2)-1}$ that flow into the negative-side grayscale-resistor group R1 to R(n/2)−1 are given by Equation (8) below using the constant-voltage sources $V_{-H}$ and $V_{-L}$.

$$I_{R1\sim R(n/2)-1} = \frac{(V_{-H} - V_{-L})}{\sum_{m=1}^{(n/2)-1} R_m} \tag{8}$$

Similarly, if the operational amplifiers $OP_{+H}$, $OP_{+l}$ are ideal, currents $I_{R(n/2)+1\ to\ Rn-1}$ that flow into the positive-side grayscale-resistor group R(n/2)+1 to Rn−1 are given by Equation (9) below using the constant-voltage sources $V_{+H}$ and $V_{+L}$.

$$I_{R(n/2)+1\sim Rn-1} = \frac{(V_{+H} - V_{+L})}{\sum_{m=(n/2)+1}^{n-1} R_m} \tag{9}$$

Next, voltage detection and voltage-to-current conversion will be described with regard to the negative side of the grayscale section.

The inverting input terminal of the operational amplifier $OP_{L1}$ is connected to the constant-voltage source $V_{-H}$, and the non-inverting input terminal of the operational amplifier $OP_{L1}$ applies feedback to the drain of the N-channel MOS transistor Q1. Accordingly, from the concept of an imaginary short at the input terminal when negative feedback is applied, the potentials of the non-inverting and inverting input terminals are the same and therefore the non-inverting input terminal also has the same potential as that of the constant-voltage source $V_{-H}$.

For the same reason, the non-inverting input terminal of the operational amplifier $OP_{L2}$ takes on the same potential as that of the constant-voltage source $V_{-L}$ connected to the inverting input terminal.

Accordingly, with regard to the grayscale section on the negative side, the voltage across the first resistor R connected between the non-inverting input terminals of the operational amplifiers OPL1 and OPL2 becomes equal to the difference voltage between the constant-voltage sources $V_{-H}$ and $V_{-L}$. A current $I_{R-}$ that flows into the first resistor R_, therefore, is given by Equation (10) below.

$$I_{R-} = \frac{(V_{-H} - V_{-L})}{R_-} \tag{10}$$

The gate and source of the N-channel MOS transistor Q2 are connected to the gate and source, respectively, of the N-channel MOS transistor Q1. Accordingly, the gate-to-source voltages of the N-channel MOS transistor Q2 and N-channel MOS transistor Q1 are equal to each other and therefore the drain currents thereof also are equal to each other. The N-channel MOS transistor Q1 and the N-channel MOS transistor Q2 construct a current mirror circuit. If we let $I_{D(Q1)}$ and $I_{D(Q2)}$ represent the drain currents of the N-channel MOS transistor Q1 and N-channel MOS transistor Q2, respectively, then Equation (11) below holds.

$$I_{D(Q1)} = I_{D(Q2)} \tag{11}$$

Similarly, the P-channel MOS transistors Q3 and Q4 also construct a current mirror circuit, and Equation (12) below holds similarly with regard to drain currents $I_{D(Q3)}$ and $I_{D(Q4)}$ of the P-channel MOS transistors Q3 and Q4.

$$I_{D(Q3)} = I_{D(Q4)} \tag{12}$$

On the other hand, Equation (13) below holds with regard to the resistor R_.

$$\sum_{m=1}^{(n/2)-1} R_m = R_- \tag{13}$$

As a result of the foregoing, the current that flows into the negative-side grayscale-resistor group R1 to R(n/2)−1 and the current that flows into the N-channel MOS transistor Q2 and P-channel MOS transistor Q4 become equal. That is, if we let $I_{R1\ to\ R(n/2)-1}$ represent the currents that flow into the resistors of the negative-side grayscale-resistor group R1 to R(n/2)−1, then Equation (14) below holds.

$$I_{R1-R(n/2)-1} = I_{D(Q2)} = I_{D(Q4)} \tag{14}$$

Thus, current flows neither into the voltage-follower-connected operational amplifier $OP_{-H}$ nor into the voltage-follower-connected operational amplifier $OP_{-L}$. As a result, these voltage-follower-connected operational amplifiers only output voltages and there is no driving current. The required characteristics are satisfied.

Next, with regard to the grayscale section on the positive side, the principle of operation is exactly the same as that of the grayscale section on the positive side and need not be described again; only the result will be stated here. Specifically, the current $I_{R+}$ that flows into the second resistor $R_+$ is given by Equation (15) below.

$$I_{R+} = \frac{(V_{+H} - V_{+L})}{R_+} \tag{15}$$

If we let $I_{D(Q5)}$ and $I_{D(Q6)}$ represent the drain currents of the N-channel MOS transistor Q5 and N-channel MOS transistor Q6, respectively, and let $I_{D(Q7)}$ and $I_{D(Q8)}$ represent the drain currents of the P-channel MOS transistor Q7 and P-channel MOS transistor Q9, respectively, then Equations (16) and (17) below hold.

$$I_{D(Q5)}=I_{D(Q6)} \tag{16}$$

$$I_{D(Q7)}=I_{D(Q8)} \tag{17}$$

Similarly, Equation (18) below holds also with regard to the resistor $R_+$.

$$\sum_{m=(n/2)+1}^{n-1} R_m = R_+ \tag{18}$$

If we let $I_{R(n/2)+1\ to\ Rn-1}$ represent the currents that flow into the resistors of the negative-side grayscale-resistor group R(n/2)+1 to Rn−1, then Equation (19) below holds.

$$I_{R(n/2)+1-Rn-1}=I_{D(Q7)}=I_{D(Q8)} \tag{19}$$

Consequently, in a manner similar to that of the negative-side grayscale power supply, current flows neither into the voltage-follower-connected operational amplifier $OP_{+H}$ nor into the voltage-follower-connected operational amplifier $OP_{+L}$. Accordingly, these voltage-follower-connected operational amplifiers only output voltages and there is no driving current. The required characteristics are satisfied.

In the embodiment set forth above, the focus is upon the voltage-follower amplifiers connected to the maximum and minimum potentials, respectively, of each of the positive-side and negative-side grayscale resistor groups, and current compensation cannot be applied with regard to amplifiers connected to the intermediate potentials, as is done in the prior art illustrated in FIGS. 6A, 6B and FIGS. 7A, 7B. However, in the case of a voltage-follower amplifier for a grayscale power supply, the conditions are most stringent for the amplifiers that are closest to the power supply. The reason for this is that there are many cases where the requirement that an output voltage close to the power supply be generated to produce a current output is difficult to design into an amplifier.

Accordingly, it is thought that there are many cases where current compensation of the kind illustrated in this embodiment is not required in a voltage-follower amplifier connected to an intermediate potential. The usefulness of this embodiment, therefore, is assured.

Thus, as described above, the grayscale voltage generating circuit according to the embodiment is such that even if the power-supply voltage fluctuates, the current that flows into grayscale resistors is detected reliably and the grayscale resistors are supplemented with current so that there is almost no output current from the voltage-follower amplifier that supplies the grayscale voltage.

In accordance with the embodiment, the arrangement described is such that a voltage drop ascribable to parasitic capacitance between LCD drivers of a plurality of LCD drivers does not occur and it is possible to prevent a decline in image quality caused by so-called block unevenness.

Though the present invention has been described in accordance with the foregoing embodiment, the invention is not limited to this embodiment and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A grayscale voltage generating circuit comprising:

a first voltage source for outputting a first voltage;

a second voltage source for outputting a second voltage having a potential lower than that of the first voltage;

a grayscale resistor having a first end and a second end connected to an output end of said first voltage source and to an output end of said second voltage source, respectively; and a circuit for detecting a difference voltage across said grayscale resistor from said first end to said second end of said grayscale resistor, converting the difference voltage to a current having a current value that corresponds to the difference voltage by passing said current through a voltage-to-current conversion resistor, and controlling output of a mirror current of said current through said voltage-to-current conversion resistor from first and second output terminals as a source current and a sink current, respectively, based on the difference voltage, wherein the first and second output terminals that output the source current and the sink current, respectively, are directly connected to the first and second ends of said grayscale resistor, respectively.

2. The circuit according to claim 1, wherein said first voltage source includes a first voltage follower that receives the first voltage as an input for driving the output terminal, which is connected to the first end of said grayscale voltage, by the first voltage; and said second voltage source includes a second voltage follower that receives the second voltage as an input for driving the output terminal, which is connected to the second end of said grayscale voltage, by the second voltage.

3. The circuit according to claim 1, wherein said grayscale resistor comprising a resistor string that includes a plurality of serially connected resistors.

4. A display device having the grayscale voltage generating circuit set forth in claim 1.

5. A grayscale voltage generating circuit comprising:

a first constant-voltage source for generating a voltage on the side of a high potential;

a second constant-voltage source for generating a voltage on the side of a low potential;

a grayscale resistor having a first end and a second end connected to an output of said first constant-voltage source and to an output of said second constant-voltage source, respectively;

a difference voltage detecting circuit for detecting a difference voltage across said grayscale resistor from said first end to said second end of said grayscale resistor; and a voltage-to-current converting circuit for converting the difference voltage to a current by passing said current through a voltage-to-current conversion resistor and controlling output of a mirror current of said current through said voltage-to-current conversion resistor as a source current and a sink current based on the difference voltage;

wherein output of the source current and output of the sink current of said voltage-to-current converting circuit are directly connected to the high potential side and to the low potential side, respectively, of said grayscale resistor.

6. The circuit according to claim 5, further comprising:

a first voltage follower circuit that receives the output voltage of said first constant-voltage source as an input and has an output connected to the first end of said grayscale resistor; and a second voltage follower circuit that receives the output voltage of said second constant-voltage source as an input and has an output connected to the second end of said grayscale resistor.

7. The circuit according to claim 6, wherein said first and second constant-voltage sources and said first and second voltage follower circuits are provided externally of a driver that is for driving a display panel; and said grayscale resistor, said difference voltage detecting circuit and said voltage-to-current converting circuit are provided internally of the driver.

8. The circuit according to claim 6, wherein said first and second constant-voltage sources are provided externally of a driver that is for driving a display panel; and said first and second voltage follower circuits, said grayscale resistor, said difference voltage detecting circuit and said voltage-to-current converting circuit are provided internally of the driver.

9. A grayscale voltage generating circuit comprising:

a first operational amplifier of voltage-follower construction having an output terminal, a non-inverting input terminal connected to an output of a first constant-voltage source that generates a voltage on a high potential side, and an inverting input terminal connected to the output terminal;

a second operational amplifier having an output terminal, a non-inverting input terminal connected to an output of a second constant-voltage source that generates a voltage on a low potential side, and an inverting input terminal connected to the output terminal;

a grayscale resistor connected between the output terminal of said first operational amplifier and the output terminal of said second operational amplifier;

a difference voltage detecting circuit for detecting a difference voltage across said grayscale resistor from the output terminal of said first operational amplifier to the output terminal of said second operational amplifier; and a voltage-to-current converting circuit for converting the difference voltage to a current by passing said current through a voltage-to-current conversion resistor and controlling output of a mirror current of said through said voltage-to-current conversion resistor current as a source current and a sink current based on the difference voltage;

wherein output of the source current and output of the sink current of said voltage-to-current converting circuit are directly connected to the high potential side and to the low potential side, respectively, of said grayscale resistor.

10. A grayscale voltage generating circuit comprising:

a first operational amplifier of voltage-follower construction having an output terminal, a non-inverting input terminal connected to an output of a first constant-voltage source that generates a voltage on a high potential side, and an inverting input terminal connected to the output terminal;

a second operational amplifier having an output terminal, a non-inverting input terminal connected to an output of a second constant-voltage source that generates a voltage on a low potential side, and an inverting input terminal connected to the output terminal;

a grayscale resistor connected between the output terminal of said first operational amplifier and the output terminal of said second operational amplifier;

a difference voltage detecting circuit for detecting a difference voltage across said grayscale resistor; and a voltage-to current converting circuit for converting the difference voltage to a current and outputting the current as a source current and a sink current;

wherein output of the source current and output of the sink current of said voltage-to-current converting circuit are connected to the high potential side and to the low potential side, respectively, of said grayscale resistor, and wherein said difference voltage generating circuit and said voltage-to-current converting circuit include:

a third operational amplifier having an inverting input terminal connected to the output of said first constant-voltage source;

a fourth operational amplifier having an inverting input terminal connected to the output of said second constant-voltage source;

a first MOS transistor of a first conductivity type having a gate connected to an output terminal of said third operational amplifier, a drain connected to a non-inverting input terminal of said third operational amplifier and a source connected to a first power supply;

a second MOS transistor of the first conductivity type having a gate and a source connected to a gate and to the source, respectively, of said first MOS transistor, and a drain connected to the first end of said grayscale resistor;

a third MOS transistor of a second conductivity type having a gate connected to an output terminal of said fourth operational amplifier, a drain connected to a non-inverting input terminal of said fourth operational amplifier and a source connected to a second power supply;

a fourth MOS transistor of the second conductivity type having a gate and a source connected to a gate and a source, respectively, of said third MOS transistor, and a drain connected to the second end of the grayscale resistor; and a voltage-to-current converting resistor connected between the non-inverting input terminal of said third operational amplifier and the non-inverting input terminal of said fourth operational amplifier.

11. The grayscale voltage generating circuit according to claim 10, further comprising:

a fifth operational amplifier of voltage-follower construction having an output terminal, a non-inverting input terminal connected to an output of a third constant-voltage source that generates a voltage on a high potential side, and an inverting input terminal connected to the output terminal;

a sixth operational amplifier having an output terminal, a non-inverting input terminal connected to an output of a fourth constant-voltage source that generates a voltage on a low potential side, and an inverting input terminal connected to the output terminal;

a second grayscale resistor connected between the output terminal of said fifth operational amplifier and the output terminal of said sixth operational amplifier;

a second difference voltage detecting circuit for detecting a difference voltage across said second grayscale resistor; and a second voltage-to current converting circuit for converting the difference voltage across said second grayscale resistor to a current and outputting the current as a source current and a sink current;

wherein output of the source current and output of the sink current of said second voltage-to-current converting circuit are connected to the high potential side and to the low potential side, respectively, of said second grayscale resistor, and wherein said second difference voltage generating circuit and said second voltage-to-current converting circuit include:

a seventh operational amplifier having an inverting input terminal connected to the output of said third constant-voltage source;

an eighth operational amplifier having an inverting input terminal connected to the output of said fourth constant-voltage source;

a fifth MOS transistor of a first conductivity type having a gate connected to an output terminal of said seventh operational amplifier, a drain connected to a non-inverting input terminal of said seventh operational amplifier and a source connected to a third power supply;

a sixth MOS transistor of the first conductivity type having a gate and a source connected to a gate and to the source, respectively, of said fifth MOS transistor, and a drain connected to the first end of said second grayscale resistor;

a seventh MOS transistor of a second conductivity type having a gate connected to an output terminal of said eighth operational amplifier, a drain connected to a non-inverting input terminal of said eighth operational amplifier and a source connected to a fourth power supply;

an eighth MOS transistor of the second conductivity type having a gate and a source connected to a gate and a source, respectively, of said seventh MOS transistor, and a drain connected to the second end of said second grayscale resistor; and a second voltage-to-current converting resistor connected between the non-inverting input terminal of said seventh operational amplifier and the non-inverting input terminal of said eighth operational amplifier.

12. The circuit according to claim 11, wherein said third constant-voltage source outputs a voltage on a high potential side of a positive grayscale voltage; and said fourth constant-voltage source outputs a voltage on a low potential side of the positive grayscale voltage.

13. The circuit according to claim 11, wherein said third constant-voltage source outputs a voltage on a high potential side of a negative grayscale voltage; and said fourth constant-voltage source outputs a voltage on a low potential side of the negative grayscale voltage.

14. The circuit according to claim 10, wherein said first constant-voltage source outputs a voltage on a high potential side of a positive grayscale voltage; and said second constant-voltage source outputs a voltage on a low potential side of the positive grayscale voltage.

15. The circuit according to claim 10, wherein said first constant-voltage source outputs a voltage on a high potential side of a negative grayscale voltage; and said second constant-voltage source outputs a voltage on a low potential side of the negative grayscale voltage.

* * * * *